(12) United States Patent
Rathei

(10) Patent No.: US 7,587,292 B2
(45) Date of Patent: *Sep. 8, 2009

(54) METHOD OF MONITORING A SEMICONDUCTOR MANUFACTURING TREND

(76) Inventor: Dieter Rathei, Bergmanngasse 44 / 6, Graz (AT) A-8010

(*) Notice: Subject to any disclaimer, the term of this patent is extended or adjusted under 35 U.S.C. 154(b) by 476 days.

This patent is subject to a terminal disclaimer.

(21) Appl. No.: 11/344,664

(22) Filed: Feb. 1, 2006

(65) Prior Publication Data

US 2007/0013398 A1 Jan. 18, 2007

Related U.S. Application Data

(60) Provisional application No. 60/700,221, filed on Jul. 18, 2005.

(51) Int. Cl.
G06F 19/00 (2006.01)
G06F 17/40 (2006.01)

(52) U.S. Cl. .................. 702/108; 702/187; 702/189

(58) Field of Classification Search .............. 702/1, 702/108, 113, 127, 182, 187, 188, 189
See application file for complete search history.

(56) References Cited

U.S. PATENT DOCUMENTS

| 2,883,255 | A | 4/1959 | Anderson |
| 3,142,820 | A | 7/1964 | Daniels |
| 3,351,910 | A | 11/1967 | Miller et al. |
| 4,849,741 | A | 7/1989 | Thomas |
| 6,240,329 | B1 * | 5/2001 | Sun .................. 700/110 |
| 6,367,040 | B1 | 4/2002 | Ott et al. |
| 6,553,521 | B1 | 4/2003 | Rathei et al. |
| 6,717,431 | B2 | 4/2004 | Rathei et al. |

FOREIGN PATENT DOCUMENTS

| JP | 61115678 | 6/1986 |
| JP | 5172581 | 7/1993 |
| JP | 2003194863 | 7/2003 |
| WO | WO 92/14322 A1 * | 8/1992 |
| WO | 03048792 | 3/2002 |

OTHER PUBLICATIONS

Rathei, D., "B. Defect Induced Parametric Yield Loss," presented at the International Symposium on Semiconductor Manufacturing (ISSM) in Tokyo, Japan, Sep. 27-29, 2004.

Ross, R., et al., "Separating Random and Systematic Defects," Technology News, Yield Management, Semiconductor International, Mar. 1999, 1 page.

Ross, R., et al., "Yield Modeling," Handbook of Semiconductor Manufacturing Technology, Ch. 26, Marcel Dekker, Inc., New York. pp. 851-868, (2000).

* cited by examiner

*Primary Examiner*—Edward R Cosimano
(74) *Attorney, Agent, or Firm*—The Nath Law Group; Jerald L. Meyer; Stanley N. Protigal

(57) ABSTRACT

A parametric parameter is selected, which has an upper specification limit and a lower specification limit. A storage percentile is determined. The storage percentile is equal to a product yield percentage if the number of the set of measurements greater than the upper specification limit exceeds the number of the set of measurements lower than the lower specification limit, and is equal to the product yield percentage subtracted from one hundred percent if the number of the set of measurements less than the lower specification limit exceeds the number of the set of measurements greater than the upper specification limit. A measurement closest to the storage percentile is stored.

20 Claims, 12 Drawing Sheets

METHOD OF MONITORING A SEMICONDUCTOR MANUFACTURING TREND

This application claims the benefit of expired U.S. Provisional Application No. 60/700,221, filed on Jul. 18, 2005, entitled METHODS FOR MONITORING, SCREENING, AND AGGREGATING INTEGRATED CIRCUIT TEST DATA FOR USE IN EVALUATING SEMICONDUCTOR MANUFACTURING PROCESSES, which application is hereby incorporated herein by reference.

CROSS-REFERENCE TO RELATED APPLICATIONS

This application relates to the following co-pending patent application having the same inventor: U.S. patent application Ser. No. 11/345,154, filed concurrently herewith, and issued as U.S. Pat. 7,496,478, entitled METHOD OF MONITORING A SEMICONDUCTOR MANUFACTURING TREND, which application is hereby incorporated herein by reference.

TECHNICAL FIELD

The present invention generally relates to semiconductor devices. In one aspect, it relates more particularly to the testing of semiconductor device and evaluating semiconductor manufacturing trends.

BACKGROUND

After a wafer has been processed in a semiconductor manufacturing process, the integrated circuits (ICs) in the wafer are typically tested in automated test equipment (ATE). In an average production facility, there may be thousands of wafers produced per month, each wafer containing thousands of ICs, and each IC requiring hundreds of tests. The results (i.e., raw data, raw test data) of each IC may require kilobytes and megabytes of storage space. The raw test data for a wafer is stored on a per-wafer basis in a yield management system (YMS) database, for example. The amount of data stored in a common YMS database is therefore in the terabytes (i.e., more than $10^{12}$ bytes).

In addition to the collection of raw test data however, it is often necessary to perform further calculations to reveal trends hidden in the raw data. The computational bandwidth and the storage capacity needed to perform additional calculations of derived parameters (i.e., electrical fault density, random yield, and systematic yield), and aggregate data (i.e., wafer means or percentiles) in many yield management systems (YMS) may be limited or non-existent. In many cases, although a YMS may have the resources to calculate and store a limited number of derived parameters and aggregate data, the calculations are performed on a limited set of test data that do not span an extended period of time. Moreover, the data may be so vast that the calculations of derived parameters and aggregate data may not be performed in a timely manner, thus causing costly delays in the identification and the rectification of defective trends in the manufacturing process.

Identification and the rectification of defective trends in the manufacturing process may be accelerated by the calculating and storing of derived parameters and aggregated statistics with respect to regions (i.e., geographically defined spatial surface areas) in each wafer. Some YMS databases may perform limited calculations of statistical aggregated data for an entire wafer, but do not include calculations that would enable process monitoring on a wafer-by-wafer basis of regional statistical aggregated data.

Hence, there is a need for a method of aggregating regional data and storing the regionally aggregated data in a manner that provides user access to the regionally aggregated data at the time the data for the wafer is generated or stored in a large database such as a YMS database.

SUMMARY OF THE INVENTION

The problems and needs outlined above may be addressed by embodiments of the present invention. In accordance with one aspect of the present invention, a method of monitoring a semiconductor manufacturing trend is shown. This method includes the following steps described in this paragraph, and the order of steps may vary, if not otherwise stated. A product yield percentage is calculated. The product yield percentage is an average of a set of yields from a selected number of wafers tested. A parametric parameter is selected. The parametric parameter has an upper specification limit and a lower specification limit. A storage percentile for a certain wafer is determined. The storage percentile is determined using a set of measurements of the parametric parameter for the certain wafer. The storage percentile is equal to the product yield percentage if the number of the set of measurements greater than the upper specification limit exceeds the number of the set of measurements lower than the lower specification limit. The storage percentile is equal to the product yield percentage subtracted from one hundred percent if the number of the set of measurements less than the lower specification limit exceeds the number of the set of measurements greater than the upper specification limit. A predetermined number of spatial regions on the certain wafer is designated. A first group of measurements from the set of measurements is obtained for a first spatial region of the spatial regions. A measurement from the first group of measurements is stored. The measurement is closest to the storage percentile.

In accordance with another aspect of the present invention, a method of monitoring a semiconductor manufacturing trend is shown. This method includes the following steps described in this paragraph, and the order of steps may vary, if not otherwise stated. A wafer is tested to obtain a set of data for the wafer. A predetermined number of spatial regions are designated on the wafer. A derived parameter for each of the spatial regions is calculated and stored based on the set of data.

In accordance with yet another aspect of the present invention, a method of monitoring a semiconductor manufacturing trend is shown. This method includes the following steps described in this paragraph, and the order of steps may vary, if not otherwise stated. A product yield percentage is calculated. The product yield percentage is an average of a set of yields from a selected number of wafers tested. A parametric parameter is selected. The parametric parameter has an upper specification limit and a lower specification limit. A storage percentile for a certain wafer is determined. The determining of the storage percentile is performed using a set of measurements of the parametric parameter for the certain wafer. The storage percentile is equal to the product yield percentage if the number of the set of measurements greater than the upper specification limit exceeds the number of the set of measurements lower than the lower specification limit. The storage percentile is equal to the product yield percentage subtracted from one hundred percent if the number of the set of measurements less than the lower specification limit exceeds the number of the set of measurements greater than the upper specification limit. A storage measurement is selected from the set of measurements closest to the storage percentile. The storage measurement is stored for the certain wafer.

In accordance with still another aspect of the present invention, a method of monitoring a semiconductor manufacturing trend is shown. This method includes the following steps described in this paragraph, and the order of steps may vary, if not otherwise stated. A product yield percentage is calculated. The product yield percentage is an average of a set of yields from a selected number of wafers tested. A parametric parameter is selected. The parametric parameter has an upper specification limit and a lower specification limit. A first storage percentile is selected. The first storage percentile is equal to the product yield percentage. A first storage measurement is selected. The first storage measurement is closest to the first storage percentile. The first storage measurement is also part of a set of measurements of the parametric parameter for a certain wafer. The first storage measurement for the certain wafer is stored. A second storage percentile is determined. The second storage percentile is equal to the product yield percentage subtracted from one hundred percent. A second storage measurement is selected. The second storage measurement is closest to the second storage percentile. The second storage measurement is part of the set of measurements of the parametric parameter for the certain wafer. The second storage measurement for the certain wafer is stored.

In accordance with a further aspect of the present invention, a method of monitoring a semiconductor manufacturing trend is shown. This method includes the following steps described in this paragraph, and the order of steps may vary, if not otherwise stated. A product yield percentage is calculated. The product yield percentage is an average of a set of wafer yields from tested wafers over a selected period of time. A parametric parameter is selected. The parametric parameter has an upper specification limit and a lower specification limit. A storage percentile for a certain wafer is determined using a set of measurements of the parametric parameter for the certain wafer. The storage percentile is equal to the product yield percentage if a number of the set of measurements greater than the upper specification limit exceeds a number of the set of measurements lower than the lower specification limit. The storage percentile is equal to the product yield percentage subtracted from one hundred percent if the number of the set of measurements less than the lower specification limit exceeds the number of the set of measurements greater than the upper specification limit. A storage measurement from the set of measurements closest to the storage percentile is selected. The storage measurement for the certain wafer is stored.

An advantage of an illustrative embodiment of the present invention is the simplification of statistical and mathematical calculations resulting from the designation of equal area to the spatial regions. Reducing the number of arithmetic computations reduces the time required to compute regional values, thus providing quicker user access to regional wafer trends.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
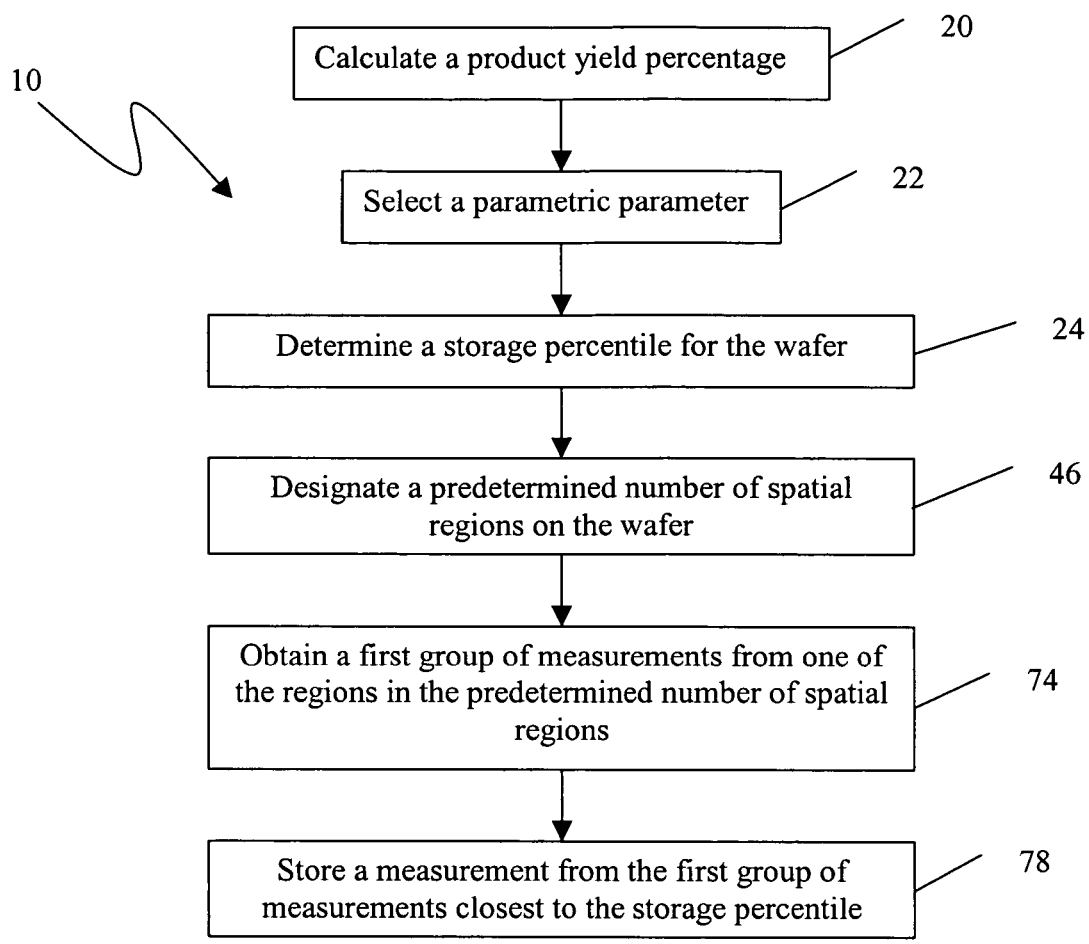
FIG. 1 is a flow chart showing steps in the first illustrative embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIGS. 1-13 show six illustrative embodiments of the present invention, which illustrate an improved method of controlling a semiconductor manufacturing process by providing quicker access to critical manufacturing statistics. Because of the sheer magnitude of test data collected from wafers in manufacturing processes, existing methods do not provide timely feedback of parameters essential to process control, such as trend calculations of test data spanning an extended period of time, and aggregate statistics of regions in the wafers, for example. An embodiment of the present invention provides quicker access to semiconductor manufacturing test statistics of wafers during wafer processing. An embodiment of the present invention also provides quick access to test statistics in predetermined spatial regions in wafers of a semiconductor manufacturing process, thus providing better control of the process. The following description of these six illustrative embodiments will illustrate how the present invention provides better control of a semiconductor manufacturing process by providing quicker access to test data in wafer regions.

Figure 2:
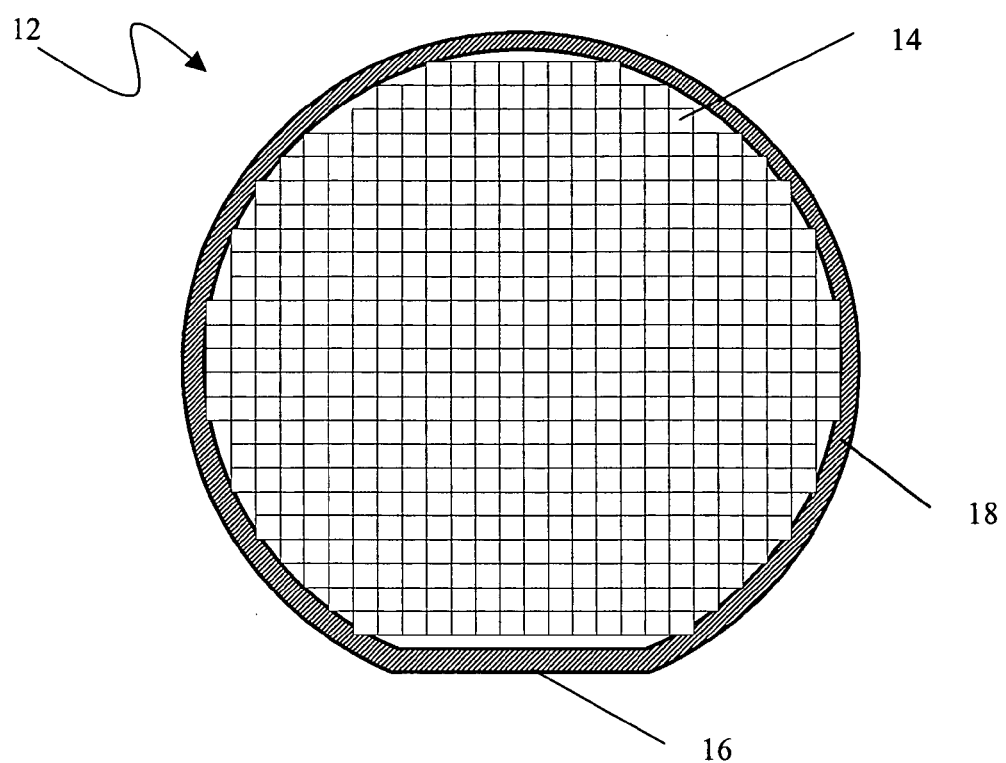
FIG. 2 is a plan view showing the wafer of the first illustrative embodiment.
Figure 3:
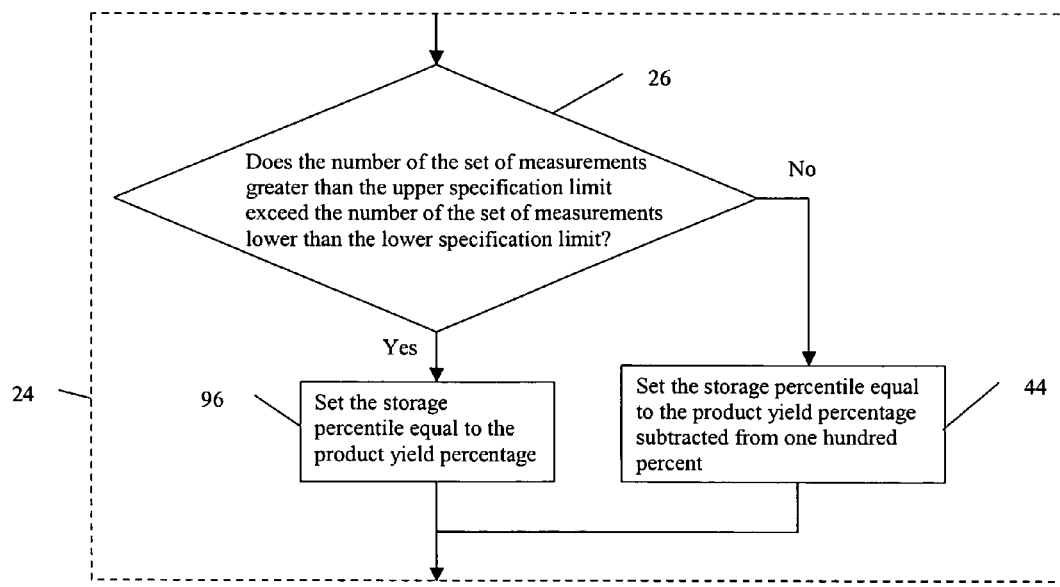
FIG. 3 is a flow chart showing more steps in the first illustrative embodiment of the present invention.
Figure 4:
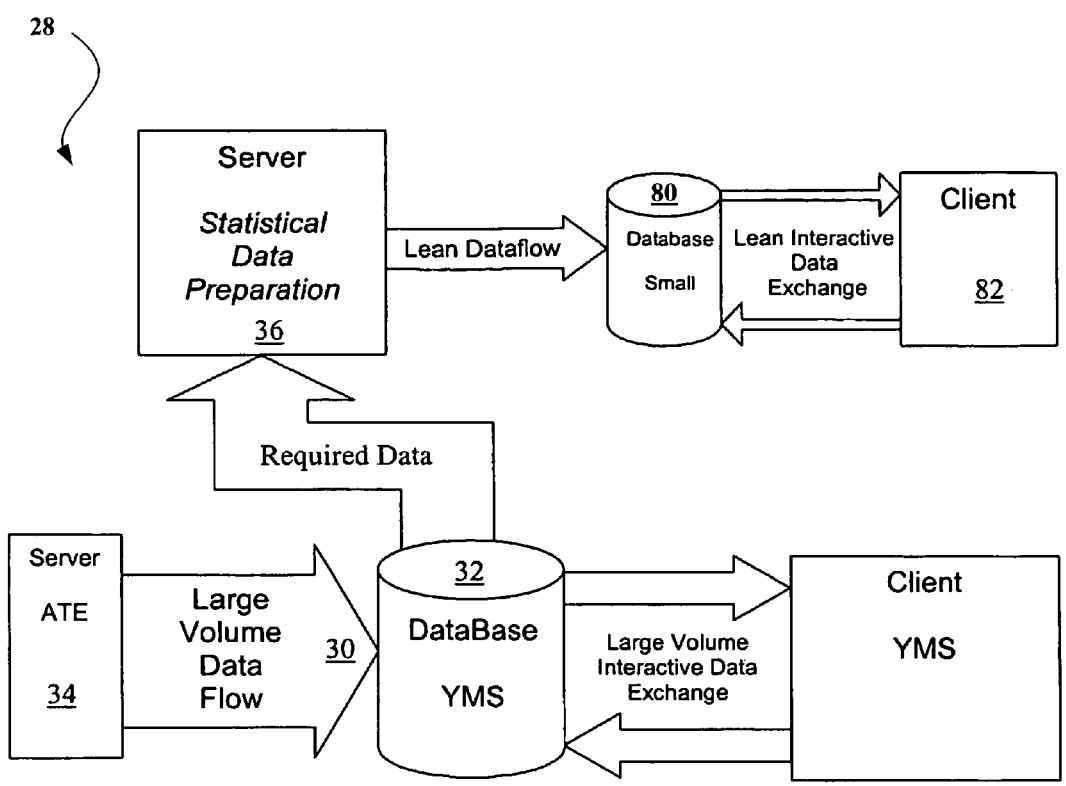
FIG. 4 is a system in the first illustrative embodiment of the present invention.
Figure 5:
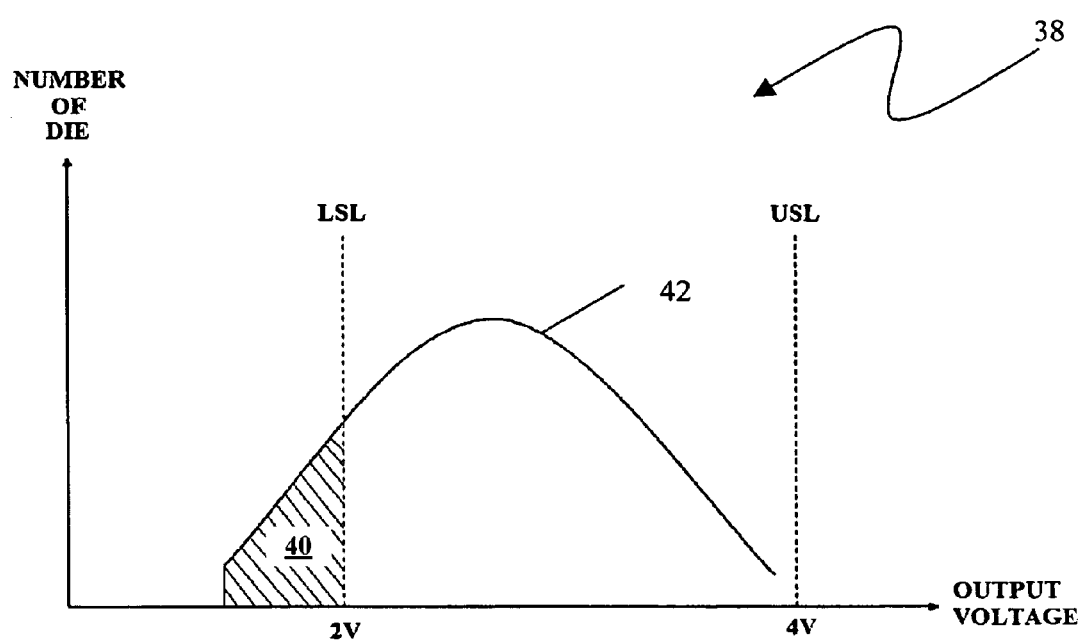
FIG. 5 is a graph illustrating the distribution of test results in accordance with the first illustrative embodiment.
Figure 6:
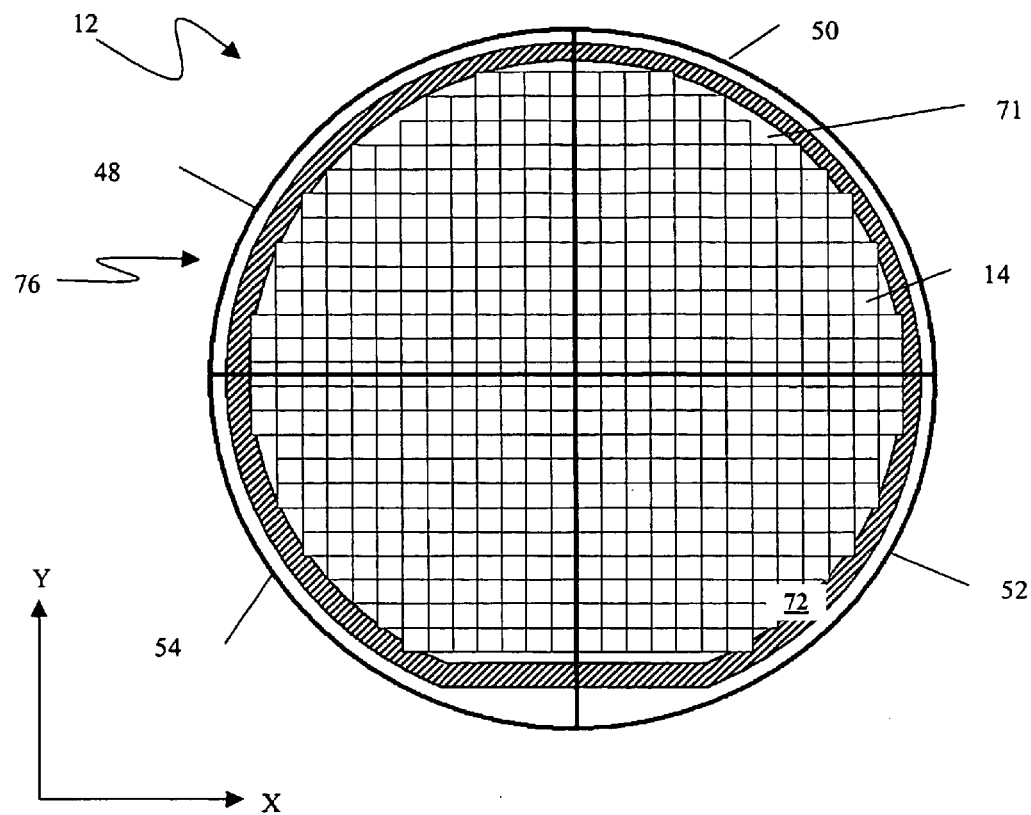
FIG. 6 is a schematic showing the designation of four spatial regions in the wafer of the first illustrative embodiment.
Figure 7:
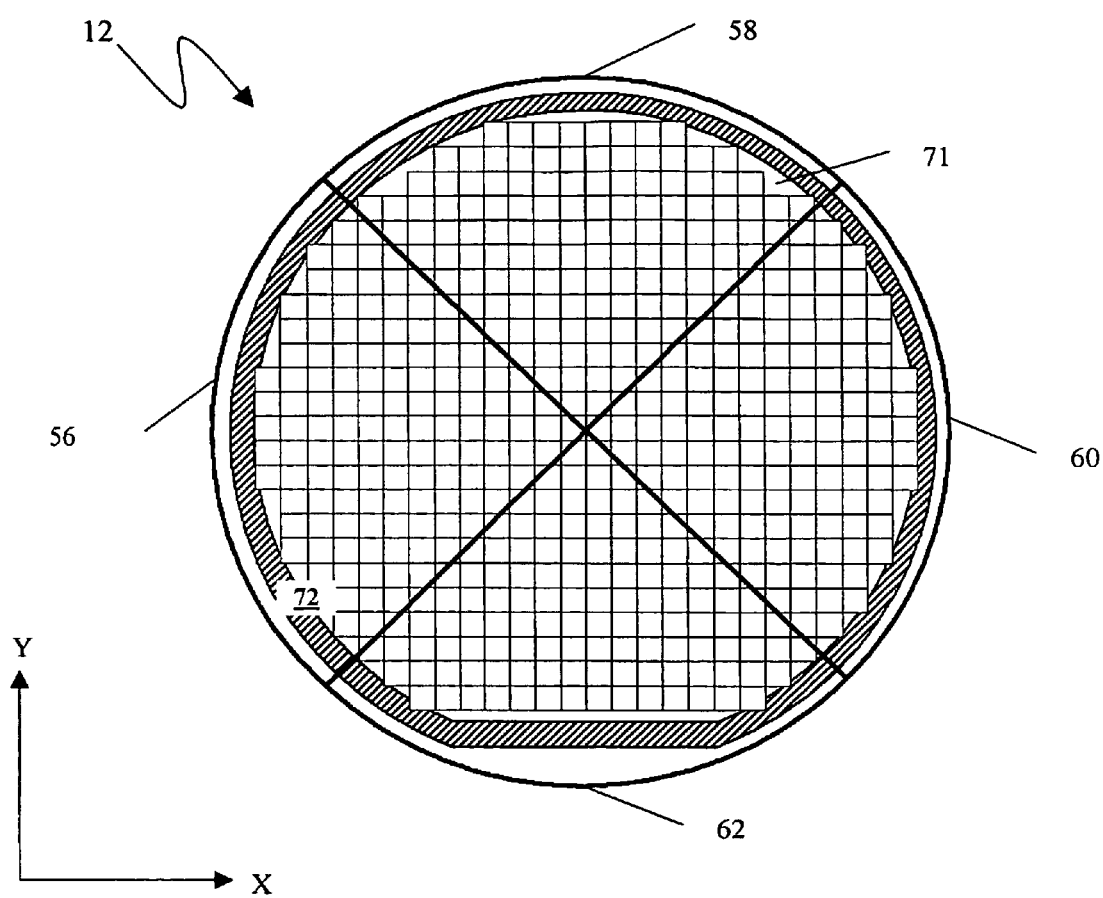
FIG. 7 is a schematic showing the designation of four more spatial regions in the wafer of the first illustrative embodiment.
Figure 8:
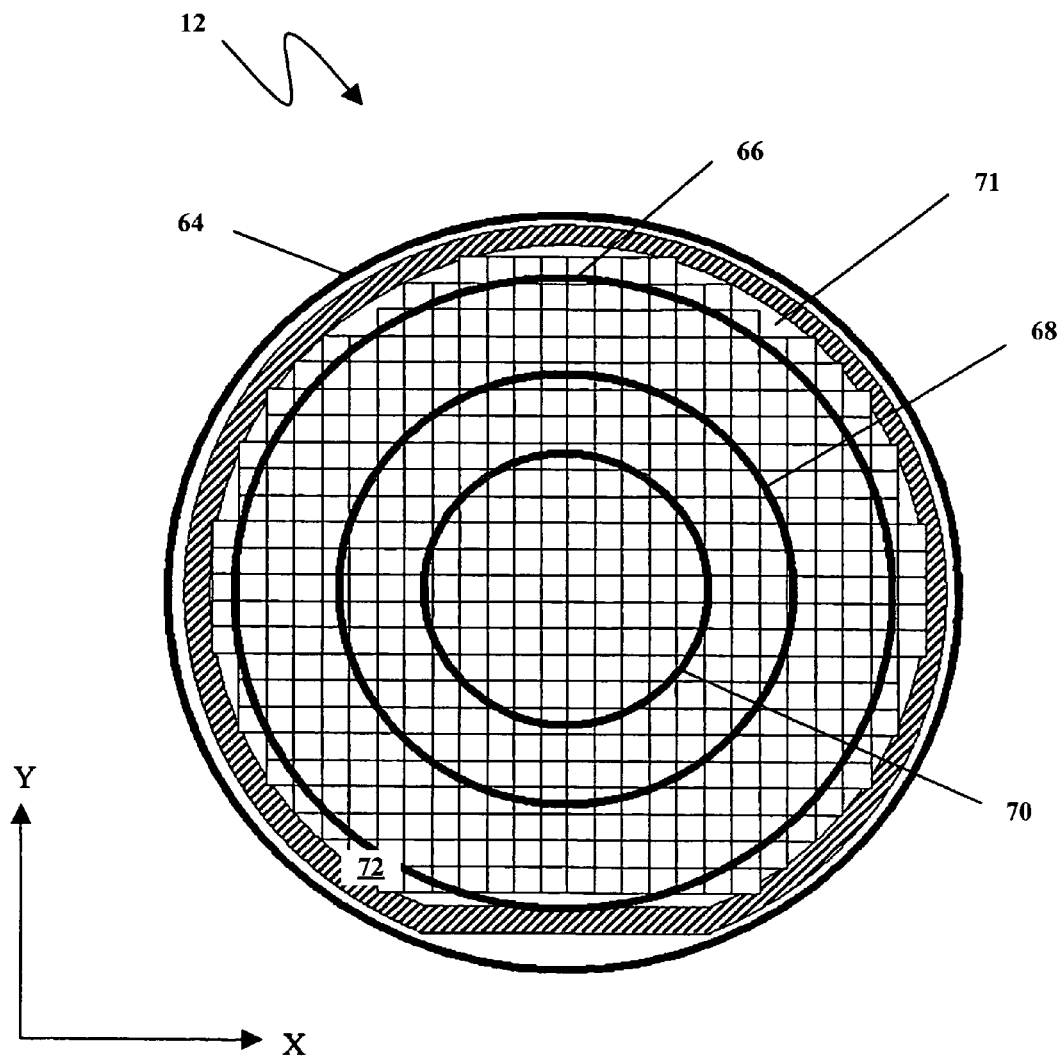
FIG. 8 is a schematic showing the designation of yet four more spatial regions in the wafer of the first illustrative embodiment.

FIGS. 1-8 show a first illustrative embodiment of the present invention, which provides a method of monitoring a semiconductor manufacturing trend on a wafer-by-wafer basis. FIGS. 1 and 3 are flow charts showing some illustrative steps in the first embodiment. The method of the first embodiment includes actions performed on a wafer, and the wafer is shown in FIG. 2. The method of the first embodiment also includes actions performed by the system shown in FIG. 4. And, the method of the first embodiment includes the designation of spatial regions in the wafer of the first embodiment. Schematics of these example spatial regions are shown in FIGS. 6-8.

The flowcharts of the first illustrative embodiment shown in FIGS. 1-3 include actions performed on the wafer 12 shown in FIG. 2. With reference now to FIG. 2, the wafer of the first illustrative embodiment is described. A suitable number of manufacturing steps have prepared the wafer 12 for testing. The wafer 12 is about 200 mm in diameter, for example, and has multiple die 14 arranged in rows and columns. Wafers in other illustrative embodiments may be any diameter (e.g., 100 mm, 150 mm, 300 mm) and may have any number of die therein (e.g., tens, hundreds, and thousands of die). The die 14 includes mixed-signal integrated circuits 14 manufactured in a bipolar complementary metal oxide semiconductor (BiCMOS) process, for example. However, the die in wafers of other illustrative embodiments may contain any semiconductor device (e.g., volatile and non-volatile memory circuits, and micro-machined electro-mechanical systems (MEMS)), and may be fabricated in any semiconductor manufacturing technology (e.g., GaAs, InP, GaN, SiGe, SiC). The wafer 12 of FIG. 2 has several features including a flat edge 16 and a wafer boundary area 18, and is merely a wafer shown for purposes of discussion herein. The present invention applies to any type of wafer, including (but not limited to) wafers with a notch (not shown) instead of a flat edge, wafers without a notch or flat edge, wafers without a wafer boundary area 18, and any combination thereof, for example.

With combined reference to FIGS. 1 and 2, the flow chart 10 in FIG. 1 shows steps performed using test data from the wafer 12 in FIG. 2. The first step 20 (see FIG. 1) of the first illustrative embodiment is performed, and the product yield percentage for the wafer 12 (see FIG. 2) is calculated to be about 67%, for example.

With reference to FIG. 2, the product yield percentage of the wafer 12 is calculated in the first illustrative embodiment by averaging the wafer yields of the 50 wafers tested immediately prior to the testing of the wafer 12. In other illustrative embodiments, the product yield percentage may be the average wafer yield of any number of prior tested wafers (e.g., the past 250 wafers, 1,000 wafers, or 10,000 wafers). In other illustrative embodiments, the average wafer yield may include the wafer yield of the wafer 12 shown in FIG. 2. For example, the calculation of the average wafer yield may be the average of the wafer yield for the wafer 12 and the 249 wafer yields of the 249 wafers processed and tested immediately preceding the wafer 12, for example.

In accordance with the first illustrative embodiment, the integrated circuits (ICs) in the set of 50 wafers used to calculate the product yield percentage are the same integrated circuits as the ICs 14 in the wafer 12. In other illustrative embodiments, all die in all wafers used to calculate the product yield percentage have the same integrated circuit product. However, the present invention is not so limited and the product in the die of the wafers used to calculate the product yield percentage may vary.

In other illustrative embodiments, the product yield percentage is calculated over a predetermined period of time. For example, the product yield percentage may be calculated by averaging the wafer yields from the wafers processed and tested in the 12 hours, 2 days, 3 weeks, or 2 months immediately preceding the testing of the wafer under test.

With reference to the wafer 12 shown in FIG. 2, product yield percentage for the wafer 12 is calculated using the wafer yield parameter of previously tested wafers. However, the product yield percentage in other illustrative embodiments may be calculated using any number of yields, and may include the use of a yield model, or a yield equation, for example. Calculation of the product yield percentage may include a single yield or a set of yields, and may include yields such as random yield, systematic yield, parametric yield, wafer fab yield, wafer probe yield, a parameter specific yield, and combinations thereof, for example.

Referring now to block 22 of the flowchart 10 shown in FIG. 1, a parametric parameter is selected. The parametric parameter selected in the first illustrative embodiment is output voltage. Parametric parameters in other illustrative embodiments also may include current and power characteristics, for example. Additional examples of parametric parameters include: on resistance, source leakage current, drain leakage current, logic input high voltage (VIH), logic input low voltage (VIL), logic output high voltage (VOH), logic output low voltage (VOL), logic input current high (IIH), logic input current low (IIL), turn on time, turn off time, read cycle time, address access time, chip select access time, write cycle time, common mode rejection (CMR), and power supply rejection (PSR), for example.

The output voltage parametric parameter of the first illustrative embodiment has a specification range, which is limited by an upper specification limit (USL) and a lower specification limit (LSL). The USL of the parametric parameter in the first illustrative embodiment is 4 volts (V) and the LSL is 2 V. In other illustrative embodiments, the parametric parameter may have only a USL or only a LSL, for example. The USL and LSL may be predetermined in accordance with customer requirements, desired user performance, and statistical modeling, for example.

In this example, the parameter may be selected regardless of computational complexity, specification range, or time duration. The user therefore has a greater selection of parameters with which to detect and correct trends and better control of the trend monitoring process.

With combined reference to FIGS. 1 and 3, the step shown in block 24 of FIG. 1 includes the steps shown in FIG. 3. In block 24 of FIG. 1, the storage percentile for the wafer 12 (see FIG. 2) is determined. The storage percentile of the first illustrative embodiment is 63%, for example. The steps performed to calculate the storage percentile of the first illustrative embodiment are shown in FIG. 3 and discussed below. In another embodiment of the present invention, the storage percentile may be rounded up or down to a nearest percentile in a predetermined set of percentiles. For example, a predetermined set of percentiles may be set in increments of 5% (e.g., 5%, 10%, . . . , 60%, 65%, 70%, . . . , 95%, 100%). In such example, the storage percentile calculated in the first illustrative embodiment (63%) may be rounded to 65% for another embodiment of the present invention, and then the storage percentile would be set to 65% for such embodiment, rather than set to 63% as in the first illustrative embodiment.

With reference to block 26 of FIG. 3, the output voltage measurements obtained from the wafer 12 (see FIG. 2) that are outside the specification range (i.e., above the USL and below the LSL) are tallied and compared. The number of measurements in the set of measurements greater than the USL is compared to the number of measurements in the set of measurements lower than the LSL. To perform the comparison, the output voltage measurements for the wafer are obtained and calculations are performed therewith.

With reference to FIG. 4, the obtaining of the output voltage measurements for the wafer 12 (see FIG. 2) and the calculations therewith, are performed in the statistical data preparation (SDP) server 28 of the first illustrative embodiment. All desired test data from the wafer 12 (see FIG. 2), which includes the output voltage parametric parameter measurements, is transferred 30 from each die 14 (see FIG. 2) in the wafer 12 (see FIG. 2) to the yield management system (YMS) database 32 by the automatic test equipment (ATE) server 34.

With continuing reference to FIG. 4, the amount of bandwidth necessary to transfer test data 30 from the wafer 12 (see FIG. 2) to the YMS database 32 in a timely manner may be in the order of kilobits (Kb), megabits (Mb), and gigabits (Gb) per second, for example. The size of the YMS database 32 is about 10 terabytes. The size of the YMS database of other illustrative embodiments may be in the order of gigabytes and terabytes, for example. The YMS database 32 may be distributed across a network of storage devices or may reside in a single storage device, for example.

With reference still to the system 28 shown in FIG. 4, the statistical data preparation (SDP) server 36 obtains the output voltage measurements of each die 14 (see FIG. 2) in the wafer 12 (see FIG. 2) from the YMS database 32. The SDP server 36 sorts the output voltage measurements into two sets: (1) a set of measurements that are above the USL for the output voltage parametric parameter, and (2) a set of measurements that are below the LSL for the output voltage parametric parameter. The number of measurements in each set of measurements is counted and stored.

The graph in FIG. 5 shows the distribution 38 of the output voltage measurements from the wafer 12 (see FIG. 2), in accordance with the first illustrative embodiment. The area 40 under the curve 42 is the number of measurements in the set of measurements lower than the LSL of 2 V. The number of measurements in the set of measurements lower than the LSL is thirty-seven measurements in this example. The graph of FIG. 5 shows that the output voltage did not measure above the USL in any of the die 14 (see FIG. 2) in the wafer 12 (see also FIG. 2), thus the number of measurements in the set of measurements greater than the USL of 4 V is zero in this example. The set of measurements having the higher number of measurements may be referred to as the dominating yield-limiting factor of the output voltage parameter, for example.

In this example, the number of the set of measurements greater than the upper specification limit does not exceed the number of the set of measurements less than the lower specification limit. In other words, the dominating yield-limiting factor for the output voltage parameter in this example is the set of measurements lower than the USL. Thus, block 44 of FIG. 3 is performed. The SDP server 36 (see FIG. 4) stores the value of 37% for the storage percentile of the wafer (100%-63%=37%).

By monitoring the dominating yield-limiting factor and setting the storage percentile accordingly, the parameters of chips closest to a specification range limit (e.g., the pass or fail limit) are effectively monitored. The effective monitoring of chips closest to the specification limits of a test parameter provides more concise process control information, which in turn provides better control of the manufacturing process, thus reducing potential lost revenue and improving quality.

Thus, in this example, a DIPYL calculation and a parameter at the storage percentile are stored in the smaller database 80 for each spatial region (two values stored for each spatial region). These values may then be used to track or identify manufacturing trends, without necessarily needing to tap into the larger YMS database 32, for example. This provides for a more manageable size of data to study trends, especially trends that take place over extended periods of time.

In this example, the storage percentile is a dynamic variable determined by the dominating yield-limiting factor and the historically averaged product yield percentage. A fixed storage percentile may be used, however a dynamic storage percentile is preferred because it enables the monitoring of trends across process boundaries, product boundaries, and technology boundaries. To provide effective trend monitoring using fixed storage percentiles, each different process, product, and technology may use a different fixed storage percentile, and the tens or hundreds of additional percentiles may add complexity to the trend monitoring process. Furthermore, a dynamic storage percentile may be preferred over a fixed percentile because a dynamic storage percentile allows for variations in yield over time, whereas a fixed percentile may not.

The completion of block 44 in FIG. 3 results in the completion of block 24 of FIGS. 1 and 3, and then block 46 of FIG. 1 is performed. As shown in FIGS. 6-8, twelve spatial regions 48-70 are designated in the wafer 12. The wafer 12 is shown underlying the schematically drawn regions 48-70 for illustrative purposes. The spatial regions 48-70 are partitions of the wafer surface area designated by coordinates on an X-Y plane of the wafer surface and typically are actually not visible in the final product. The spatial regions 48-70 shown in FIGS. 6-8 are schematic representations and are not necessarily drawn to scale.

The shapes of the twelve spatial regions 48-70 of the first illustrative embodiment in FIGS. 6-8 have been formed to detect trends in the semiconductor manufacturing process in a minimal amount of time. For example, with reference now to FIG. 8, the spatial areas 64-70 are patterned in a manner similar to the flow of photoresist across the wafer 12. Photoresist may be applied to the center of the wafer 12 and may be drawn toward the outer edges of the wafer by a centrifugal force applied to the wafer 12. As the photoresist flows from the center toward the outer edge of the wafer 12, concentric circular patterns may develop in the photoresist. The spatial regions 64-70, also having concentric circular shapes, may provide better detection of trends in the application and distribution of photoresist on the wafer 12, for example.

Each of the twelve spatial regions 48-70 in the first illustrative embodiment has about the same area, which simplifies statistical calculations and reduces the computing time in the SDP server 36 (see FIG. 4), and enables delivery of regional aggregate test data to the user in a timely manner. In other illustrative embodiments in which spatially disproportionate regions are necessarily mapped onto the wafer, the present invention also provides timely delivery of aggregate test data.

In other illustrative embodiments, any number of regions may be designated in any shape or form, such as 2 spatial regions, 6 spatial regions, 9 spatial regions, and 24 spatial regions, for example. The regions 64-70 in FIG. 8 are concentrically oriented relative to each other. Although the regions 48-70 are shown in groups of four, the designated spatial regions in other illustrative embodiments may be grouped or ungrouped as is necessary.

The sum of areas for the four spatial regions 48-54 shown in FIG. 6 is equal to or greater than the total top surface area of the wafer 12. The total top surface area of the wafer 12 includes the inner portion of the wafer 71 in which a majority of the die 14 reside, and the wafer boundary area 18. In other illustrative embodiments, the top surface area may not include a wafer boundary area. The sum of areas for the four spatial regions 56-62 shown in FIG. 7 is equal to or greater than the total top surface area 72 of the wafer 12. Finally, the sum of the areas of the four spatial regions 64-70 shown in FIG. 8 is equal to or greater than a total top surface area 72 of the wafer 12. In other illustrative embodiments, the cumulative area of the wafer covered by spatial regions may be less than 100%. For example, in other illustrative embodiments of the present invention the spatial regions may cover a cumulative wafer surface area of about 90%, 50%, or 25%, for example.

Referring again to the flowchart 10 shown in FIG. 1, block 74 is performed. With joint reference to FIGS. 4 and 6, the SDP server 36 (FIG. 4), having obtained the voltage output measurements from the YMS database 32 (FIG. 4), determines which measurements belong to the die 76 (FIG. 6), e.g., die 14, in the spatial region 48 (FIG. 6). Assuming there are one hundred die in spatial region 48 for this example, the SDP server 36 (FIG. 4) selects the set of one hundred measurements from the one hundred die 76 (FIG. 6) in the spatial region 48 (FIG. 6) for further processing.

Referring now to FIG. 1, block 78 is performed in accordance with the first illustrative embodiment. With joint reference again to FIGS. 4 and 6, the SDP server 36 (FIG. 4) calculates the 37th percentile measurement in the group of one hundred measurements from the die 76 (FIG. 6) in the spatial region 48 (FIG. 6). The group of one hundred measurements from the die 76 (FIG. 6) in the spatial region 48 (FIG. 6) may be sorted in ascending order. The lowest output voltage measurement is listed as the first measurement and the highest output voltage measurement is listed as the 100th measurement. In accordance with block 78 (see FIG. 1) the 37th measurement in the sorted group of one hundred measurements is closest to the 37th percentile of the group of measurements from the die 76 (FIG. 6) of spatial region 48 (FIG. 6). The 37th measurement is about 1.98 V (in this example), and is the closest measurement to the LSL of 2 V in the group of measurements below the LSL. For example, the 36th percentile measurement is about 1.95 V.

Referring now to FIG. 4 in which the system 28 of the first illustrative embodiment is shown, the SDP server 36 stores the 37th percentile measurement in the small database 80. The size of the small database 80 is about 10 gigabytes in this example. In other illustrative embodiments the size of the small database may be in the order of megabytes or gigabytes, and may be at least an order of magnitude smaller (i.e., 10-1) than the YMS database.

With continuing reference to FIG. 4, the defect induced parametric yield loss (DIPYL) derived parameter for the spatial region 48 (see FIG. 6) is calculated and stored by the SDP server 36. In other illustrative embodiments, derived parameters for spatial regions in the wafer are calculated at the time the measurements are obtained from the wafer by the ATE.

The SDP server 36 stores the DIPYL in the small database 80. The calculation of the DIPYL is described in a paper by Dieter Rathei entitled "Defect Induced Parametric Yield Loss", presented at the International Symposium on Semiconductor Manufacturing (ISSM), Sep. 27-29, 2004 in Tokyo Japan, and incorporated herein by reference. In other illustrative embodiments, other derived parameters may be calculated and stored, including electrical fault density, random yield, systematic yield, and combinations thereof, for example. It is preferred to perform such calculations shortly after the testing of the wafer 12 (e.g., within an hour, within a day), but they may be performed at any time after the testing of the wafer 12.

In the first illustrative embodiment, blocks 74 and 78 (see FIG. 1) are repeated for each of the other eleven wafer regions 50-70. The DIPYL is also calculated for each region, and the DIPYL is stored in the database for quick user access. Thus, in this example, a DIPYL calculation and a parameter at the storage percentile are stored in the smaller database 80 for each spatial region (two values stored for each spatial region). These values may then be used to track or identify manufacturing trends, without necessarily needing to tap into the larger YMS database 32, for example. This provides for a more manageable size of data to study trends, especially trends that take place over extended periods of time.

With reference to the system of the first illustrative embodiment shown in FIG. 4, a user may access the region specific aggregate data (i.e., storage percentile parametric parameters, derived parameters) from the small database 80 via the small database client 82. The small database client 82 may be a single networked device or a network of devices, for example. In the present illustrative embodiment, the aggregate data for the region 48 (see FIG. 12) is stored in the small database 80 and may be available to a user less than a minute after the ATE server 34 has completed transferring test data to the YMS database 32. In other illustrative embodiments, the region specific aggregate data is available in less than an hour, less than half an hour, less than 30 seconds, and less than 5 seconds after the completion of wafer testing by the testing device, for example. Also, in other embodiments, the configuration and set-up of databases and equipment for the system 28 may vary from the example system shown in FIG. 4.

A second illustrative embodiment includes the first illustrative embodiment as described above and illustrated in FIGS. 1-8. In the second illustrative embodiment however, block 24 of FIG. 1 and block 78 of FIG. 1 are performed at about the same time the derived parameters for the region 48 (see FIG. 6) are calculated. The simultaneous calculations of the derived parameters and the actions in blocks 24 and 78 may be performed in a number of ways, including threaded processes in a single central processing unit (CPU), and distributed processes across multiple CPUs, for example.

The second embodiment illustrates that multiple calculations in the present invention may be performed simultaneously, thus expediting the delivery of the aggregated regional data to the smaller database 80 (see FIG. 4). The expedited delivery of information essential for efficient control of the manufacturing process may provide cost savings, such as cost savings from wafer defect prevention, for example.

Figure 9:
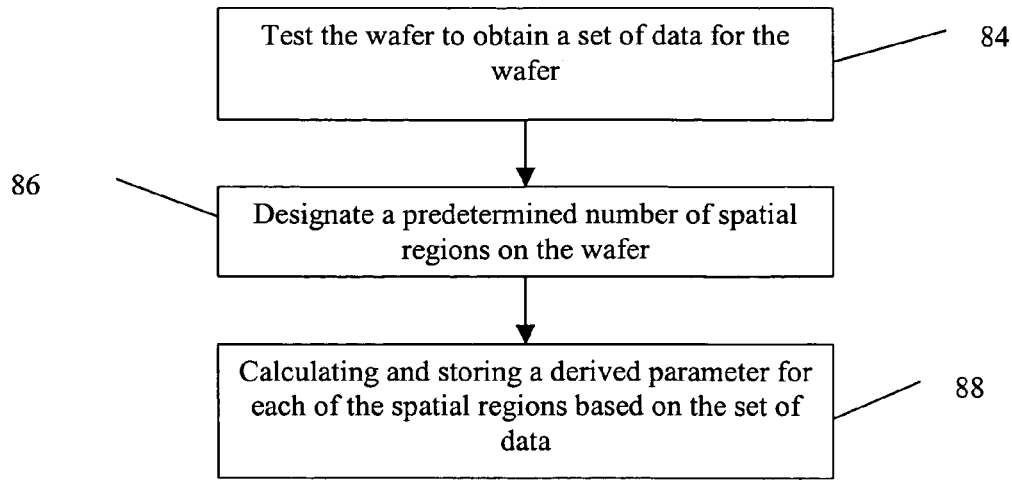
FIG. 9 is a flow chart showing a third illustrative embodiment of the present invention.

FIG. 9 shows a third illustrative embodiment of the present invention. The third embodiment includes FIG. 2 and FIGS. 6-8 of the first illustrative embodiment, in which the wafer 12 and designated spatial regions 48-70 are shown. In block 84 of FIG. 9, the wafer 12 (see FIG. 2) is tested and a set of test results is obtained. The set of test results may also be referred to as the set of data. As shown in block 86 of FIG. 9, the twelve spatial regions 48-70 (see FIGS. 6-8) are designated on the wafer 12 (see FIGS. 6-8). In block 88 of FIG. 9, a derived parameter for each of the spatial regions 48-70 is calculated and stored based on the test results. These results may be stored in a smaller database (see e.g., small database 80 in FIG. 4) for use in monitoring manufacturing trends.

Figure 10:
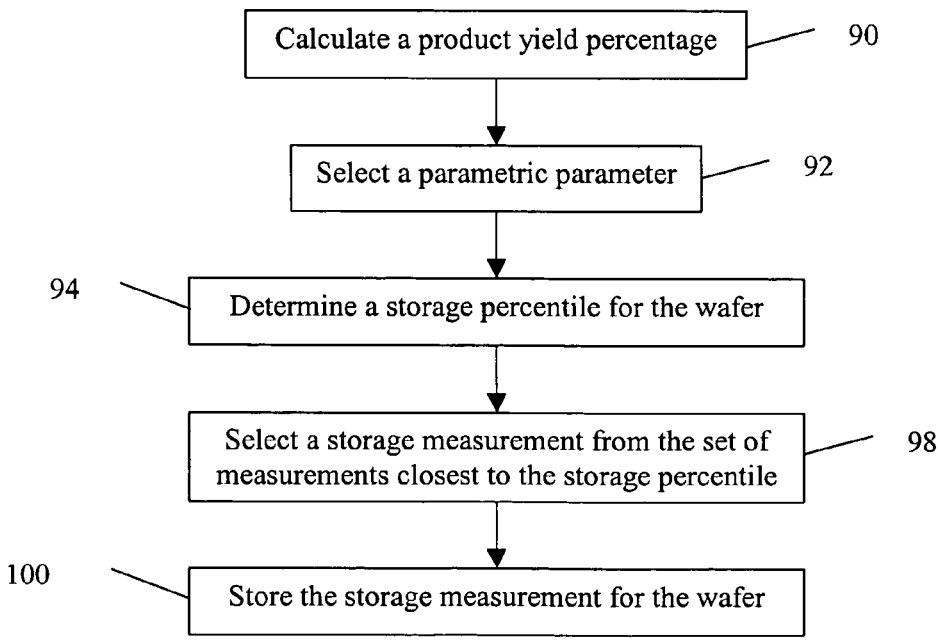
FIG. 10 is a flow chart showing a fourth illustrative embodiment of the present invention.

The fourth illustrative embodiment of the present invention is shown in FIG. 10. The fourth illustrative embodiment includes the wafer 12 (see FIG. 2) of the first illustrative embodiment. Test data is obtained from the wafer 12 (see FIG. 2) by a testing device and stored as a set of measurements. The set of measurements includes the measurements for the parametric parameter of all tested die in the wafer. For this example, the number of die tested in the wafer of the fourth embodiment is 150. In block 90, a product yield percentage is calculated by calculating the average wafer yield of a set of wafer yields of wafers processed and tested in the previous 72 hours, for example. The product yield percentage of the third illustrative embodiment is about 88% in this example.

In block 92 of FIG. 10, a parametric parameter is selected. The parametric parameter has a specification range bounded by an upper specification limit (USL) and a lower specification limit (LSL). Two sets of measurements are generated by comparing the stored set of measurements of the fourth embodiment to the USL and LSL of the parametric parameter. The two sets are: (1) set of measurements greater than the upper specification limit and (2) a set of measurements lower than the lower specification limit.

As shown in block 94 of FIG. 10, a storage percentile for the wafer under test is determined. Block 94 includes the steps 24 of the first illustrative embodiment shown in FIG. 3. With reference to FIG. 3, decision block 26 compares the number of the set of measurements greater than the USL to the number of the set of measurements lower than the LSL. In the present illustrative embodiment, the number of the set of measurements greater than the USL exceeds the number of the set of measurements lower than the LSL. Accordingly, in block 96 of FIG. 3, the storage percentile is set equal to the product yield percentage of 88% in this example.

As shown in block 98 of the fourth illustrative embodiment shown in FIG. 10, a storage measurement is selected from the set of measurements closest to the storage percentile. The storage measurement closest to the storage percentile of 88% is the 132nd measurement from the set of 150 measurements obtained from the tested die 14 (see FIG. 2) in the wafer 12 (see FIG. 2). In block 100 of the fourth illustrative embodiment shown in FIG. 10, the storage measurement is stored in a small database and linked to the lot and wafer identification of the wafer 12 (see FIG. 2) of the fourth illustrative embodiment.

Figure 11:
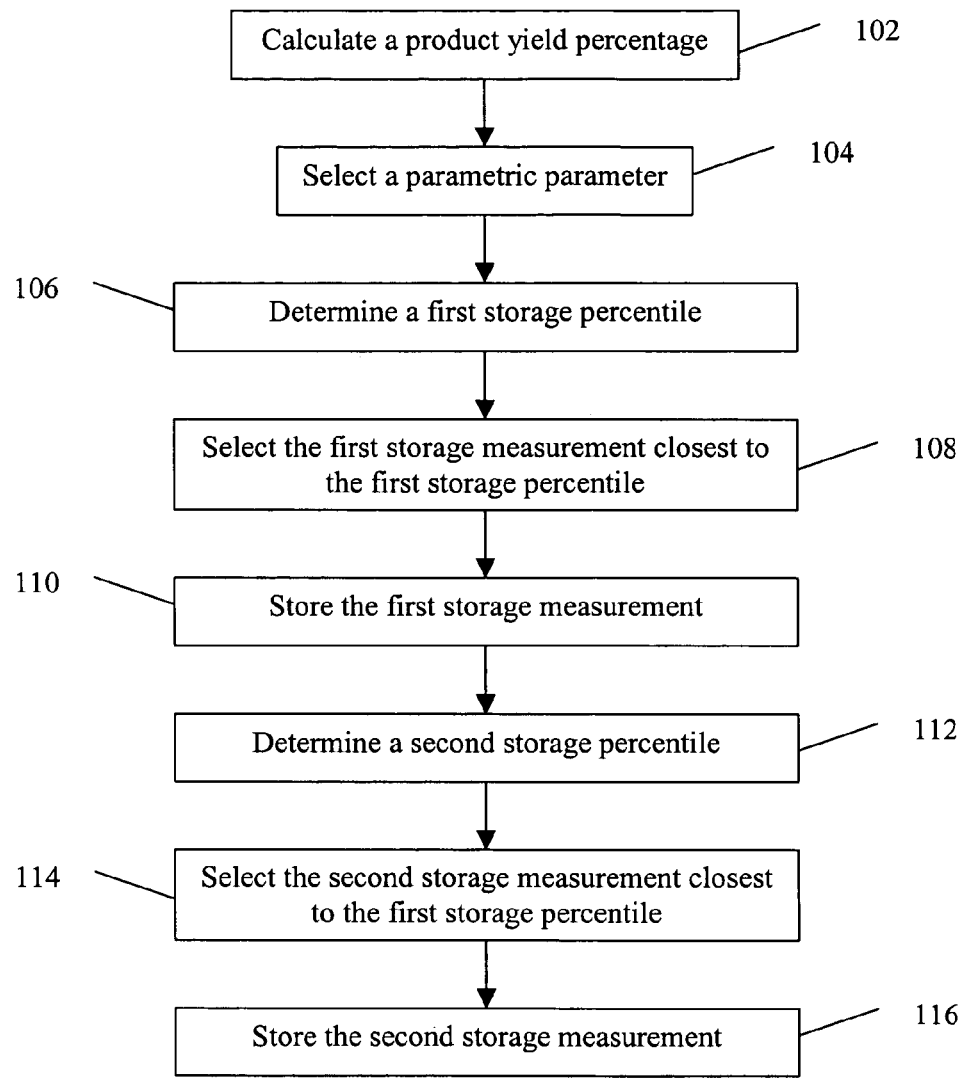
FIG. 11 is a flow chart showing a fifth illustrative embodiment of the present invention.

A fifth illustrative embodiment of the present invention is shown in FIG. 11. The wafer of the fifth illustrative embodiment is a p-type silicon wafer with 1000 die. Each die in the wafer is tested and the test data for the 1000 die is stored in a yield management system database.

In block 102 of FIG. 11, a product yield percentage is calculated. The product yield percentage is the average of the yields of the previous 500 wafers tested, in this example.

In block 104 of FIG. 11, a parametric parameter is selected. The parametric parameter has a specification range. The specification range has an upper specification limit (USL) and a lower specification limit (LSL).

In block 106 of the fifth embodiment shown in FIG. 11, two storage percentiles are calculated and stored. The first storage percentile is set equal to the product yield percentage. In block 108 of FIG. 11, a first storage measurement is selected. The first storage measurement is closest to the first storage percentile. The first storage measurement is also part of a set of measurements of the parametric parameter for a certain wafer. In block 110 of FIG. 11, the first storage measurement for the wafer of the fifth embodiment is preferably stored in a smaller database.

In block 112 of FIG. 11, a second storage percentile is determined. The second storage percentile is equal to the product yield percentage subtracted from one hundred percent. In block 114 of FIG. 11, a second storage measurement is selected from the set of measurements obtained from the wafer. The second storage measurement is closest to the second storage percentile. The second storage measurement is part of the set of measurements of the parametric parameter for the wafer. In block 116 of FIG. 11, the second storage measurement for the wafer of the fifth illustrative embodiment is stored in the small database.

Figure 12:
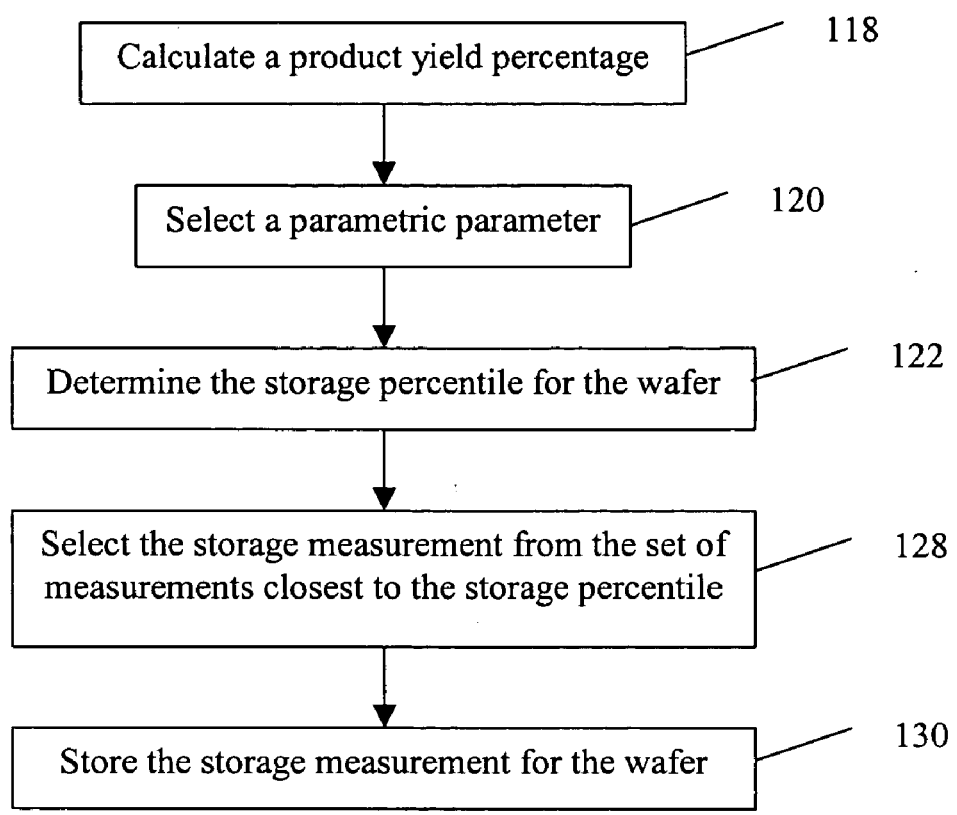
FIG. 12 is a flow chart showing a sixth illustrative embodiment of the present invention.

A sixth illustrative embodiment of the present invention is shown in FIG. 12. In accordance with block 118 of the sixth embodiment, a test wafer is placed in a wafer probe and wafer test data is obtained. The wafer test data obtained from the test wafer by the wafer probe is stored in a yield management system database. A product yield percentage is calculated by averaging the wafer yield of the test wafer and wafers that were tested in the previous three weeks.

In block 120 of the sixth illustrative embodiment shown in FIG. 12, a test engineer selects a parametric parameter to be output current. The parametric parameter has an upper specification limit (USL) of 3.5 milliamps (mA) and a lower specification limit (LSL) of 1.5 mA in this example.

In block 122 of the sixth illustrative embodiment shown in FIG. 12, a storage percentile for the test wafer is determined using a set of measurements of the output current parametric parameter for the test wafer. The set of measurements for the output current parametric parameter includes the measurements for each die that has been tested in the test wafer.

Figure 13:
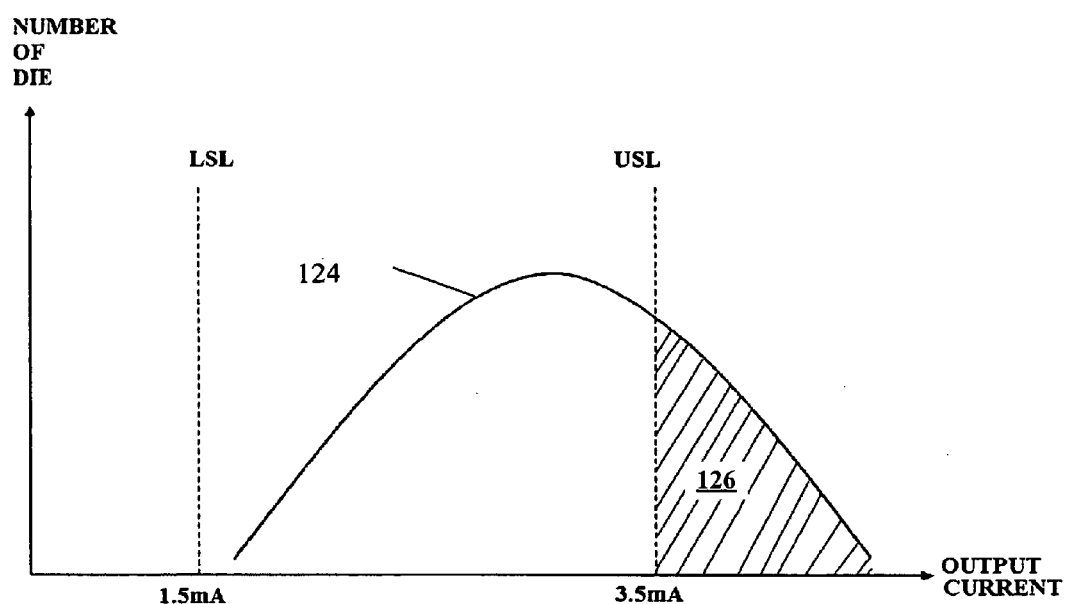
FIG. 13 is a graph illustrating the distribution of test results in accordance with the sixth illustrative embodiment.

The distribution of the output current test results for the test wafer of the sixth illustrative embodiment is shown in FIG. 13. The curve 124 in FIG. 13 shows the distribution of the set of measurements for the output current parametric parameter in the test wafer. The shaded area 126 under the curve 124 represents the number of measurements in the set of measurements that are greater than the USL of 3.5 mA. In the present illustrative embodiment, the number of measurements in the set of measurements that are greater than the USL is ten measurements. The number of measurements in the set of measurements that are less than the LSL of 1.5 mA is zero.

Referring to block 128 of the sixth illustrative embodiment shown in FIG. 12, a storage measurement from the set of measurements closest to the storage percentile is selected. In block 130 of FIG. 12, the storage measurement for the test wafer is preferably stored in a smaller database, which is quickly accessible to the test engineer.

An advantage of an illustrative embodiment of the present invention is the simplification of statistical and mathematical calculations resulting from the designation of equal area to the spatial regions. Reducing the number of arithmetic computations reduces the time required to compute regional values, thus providing quicker user access to regional wafer trends.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of monitoring a semiconductor manufacturing trend, comprising:
    testing a wafer to obtain a set of data for the wafer;
    designating a predetermined number of spatial regions on the wafer;
    calculating and storing a derived parameter using data from each die within each of the spatial regions based on the set of data; and
    calculating a product yield percentage to provide trend calculations of test data spanning an extended period of time, the product yield percentage being an average of a set of yields from a selected number of wafers tested.

2. The method of claim 1, wherein the derived parameter is selected from the group consisting of electrical fault density, random yield, systematic yield, defect induced parametric yield loss, and combinations thereof.

3. The method of claim 1, wherein each of the spatial regions has about a same area therein.

4. The method of claim 1, wherein at least some of the spatial regions are pie shaped.

5. The method of claim 1, wherein at least one of the spatial regions is circular shaped.

6. The method of claim 1, wherein at least some of the spatial regions are concentrically oriented relative to each other.

7. The method of claim 1, wherein at least some of the spatial regions are ring shaped.

8. The method of claim 1, wherein a sum of areas for all of the spatial regions is equal to or greater than a total top surface area of the wafer.

9. The method of claim 1, wherein the predetermined number of spatial regions is twelve.

10. A method of monitoring a semiconductor manufacturing trend, comprising:
    calculating a product yield percentage, the product yield percentage being an average of a set of yields from a selected number of wafers tested;
    selecting a parametric parameter having an upper specification limit and a lower specification limit;
    determining a storage percentile for a certain wafer, wherein the determining of the storage percentile is performed using a set of measurements of the parametric parameter for the certain wafer, wherein the storage percentile is equal to the product yield percentage if a number of the set of measurements greater than the upper specification limit exceeds a number of the set of measurements lower than the lower specification limit, and wherein the storage percentile is equal to the product yield percentage subtracted from one hundred percent if the number of the set of measurements less than the lower specification limit exceeds the number of the set of measurements greater than the upper specification limit;
    selecting a storage measurement from the set of measurements closest to the storage percentile; and
    storing the storage measurement for the certain wafer.

11. A method of monitoring a semiconductor manufacturing trend, comprising:
    calculating a product yield percentage, the product yield percentage being an average of a set of wafer yields from tested wafers over a selected period of time;
    selecting a parametric parameter having an upper specification limit and a lower specification limit;
    determining a storage percentile for a certain wafer, wherein the determining of the storage percentile is performed using a set of measurements of the parametric parameter for the certain wafer, wherein the storage percentile is equal to the product yield percentage if a number of the set of measurements greater than the upper specification limit exceeds a number of the set of measurements lower than the lower specification limit, and wherein the storage percentile is equal to the product yield percentage subtracted from one hundred percent if the number of the set of measurements less than the lower specification limit exceeds the number of the set of measurements greater than the upper specification limit;
    selecting a storage measurement from the set of measurements closest to the storage percentile; and
    storing the storage measurement for the certain wafer.

12. The method of claim 11, wherein the selected period of time is set by a software user before the calculating of the product yield percentage.

13. The method of claim 11, wherein the selected period of time is selected from the group consisting of 12 hours, 2 days, 3 weeks, and 2 months.

14. A method of monitoring a semiconductor manufacturing trend, comprising:
    testing a wafer to obtain a set of data for the wafer having a plurality of measurement positions;
    designating a predetermined number of spatial regions on the wafer;
    calculating and storing a derived parameter using data from each measurement position within each of the spatial regions based on the set of data; and
    calculating a product yield percentage to provide trend calculations of test data spanning an extended period of time, the product yield percentage being an average of a set of yields from a selected number of wafers tested.

15. The method of claim 14, wherein the derived parameter is selected from the group consisting of electrical fault density, random yield, systematic yield, defect induced parametric yield loss, and combinations thereof.

16. The method of claim 14, wherein each of the spatial regions has about a same area therein.

17. The method of claim 14, wherein at least some of the spatial regions are pie shaped.

18. The method of claim 14, wherein at least one of the spatial regions is circular shaped or ring shaped.

19. The method of claim 14, wherein at least some of the spatial regions are concentrically oriented relative to each other.

20. The method of claim 14, wherein a sum of areas for all of the spatial regions is equal to or greater than a total top surface area of the wafer.

* * * * *